(12) United States Patent
Kang et al.

(10) Patent No.: US 8,884,158 B2
(45) Date of Patent: Nov. 11, 2014

(54) SOLAR CELL AND SOLAR CELL MODULE

(75) Inventors: Juwan Kang, Seoul (KR); Jihoon Ko, Seoul (KR); Jonghwan Kim, Seoul (KR); Daehee Jang, Seoul (KR)

(73) Assignee: LG Electronics Inc., Seoul (KR)

(*) Notice: Subject to any disclaimer, the term of this patent is extended or adjusted under 35 U.S.C. 154(b) by 793 days.

(21) Appl. No.: 12/692,287

(22) Filed: Jan. 22, 2010

(65) Prior Publication Data

US 2011/0083715 A1 Apr. 14, 2011

(30) Foreign Application Priority Data

Oct. 8, 2009 (KR) .................. 10-2009-0095449

(51) Int. Cl.
*H01L 31/0224* (2006.01)
*H01L 31/05* (2014.01)

(52) U.S. Cl.
CPC .... *H01L 31/0516* (2013.01); *H01L 31/022458* (2013.01); *Y02E 10/52* (2013.01)
USPC .............. 136/256; 136/244; 136/252

(58) Field of Classification Search
CPC ................................. H01L 31/022433
See application file for complete search history.

(56) References Cited

U.S. PATENT DOCUMENTS

| | | | | |
|---|---|---|---|---|
| 4,865,999 A * | 9/1989 | Xi et al. | ............ | 438/83 |
| 5,391,235 A | 2/1995 | Inoue | | |
| 2009/0183759 A1 | 7/2009 | Hishida | | |
| 2009/0188550 A1* | 7/2009 | Moon et al. | .................. | 136/255 |
| 2010/0139746 A1* | 6/2010 | Von Maydell et al. | ........ | 136/255 |
| 2010/0240169 A1* | 9/2010 | Petti et al. | ...................... | 438/68 |

FOREIGN PATENT DOCUMENTS

| | | |
|---|---|---|
| CN | 101494249 A | 7/2009 |
| JP | 6-21501 A | 1/1994 |
| JP | 2005-191479 A | 7/2005 |
| JP | 2008-282990 A | 11/2008 |
| JP | 2009-123761 A | 6/2009 |
| JP | 2009-176782 A | 8/2009 |
| WO | WO 2008113741 A2 * | 9/2008 |

* cited by examiner

*Primary Examiner* — Eli Mekhlin
*Assistant Examiner* — Magali P Slawski
(74) *Attorney, Agent, or Firm* — Birch, Stewart, Kolasch & Birch, LLP

(57) ABSTRACT

A solar cell and a solar cell module including a plurality of solar cells are discussed. The solar cell according to an embodiment includes a substrate of a first conductive type, an emitter layer of a second conductive type opposite the first conductive type disposed on the substrate, a plurality of first electrodes electrically connected to the emitter layer, a second electrode electrically connected to the substrate, a first current collector electrically connected to the plurality of first electrodes, and a second current collector electrically connected to the second electrode. The second current collector includes a plurality of second electrode current collectors electrically connected to the second electrode, and a current collector connector for connecting the plurality of second electrode current collectors to one another.

13 Claims, 8 Drawing Sheets

SOLAR CELL AND SOLAR CELL MODULE

This application claims priority to and the benefit of Korean Patent Application No. 10-2009-0095449 filed in the Korean Intellectual Property Office on Oct. 8, 2009, the entire contents of which are incorporated herein by reference.

BACKGROUND OF THE INVENTION

1. Field of the Invention

Embodiments of the invention relate to a solar cell and a solar cell module.

2. Description of the Related Art

Recently, as existing energy sources such as petroleum and coal are expected to be depleted, interests in alternative energy sources for replacing the existing energy sources are increasing. Among the alternative energy sources, solar cells have been particularly spotlighted because, as cells for generating electric energy from solar energy, the solar cells are able to draw energy from an abundant source and do not cause environmental pollution.

A solar cell generally includes a substrate and an emitter layer, each of which is formed of a semiconductor, and electrodes respectively formed on the substrate and the emitter layer. The semiconductors forming the substrate and the emitter layer have different conductive types, such as a p-type and an n-type. A p-n junction is formed at an interface between the substrate and the emitter layer.

When light is incident on the solar cell, a plurality of electron-hole pairs are generated in the semiconductors. The electron-hole pairs are separated into electrons and holes by the photovoltaic effect. Thus, the separated electrons move to the n-type semiconductor (e.g., the emitter layer) and the separated holes move to the p-type semiconductor (e.g., the substrate), and then the electrons and holes are collected by the electrodes electrically connected to the emitter layer and the substrate, respectively. The electrodes are connected to each other using electric wires to thereby obtain electric power.

At least one current collector, such as a bus bar, is positioned on each of the emitter layer and the substrate, and the current collector on the emitter layer is connected to the electrode electrically connected to the emitter layer and the current collector on the substrate is connected to the electrode electrically connected to the substrate. Thus, the electrons and the holes collected by the corresponding electrodes of the emitter layer and the substrate move to a load connected to the outside through the corresponding current collectors.

However, in this case, because the current collectors are formed on the emitter layer on an incident surface of the substrate, on which light is incident, as well as a non-incident surface of the substrate, on which light is not incident, an incident area of light decreases. Hence, efficiency of the solar cell is reduced.

Accordingly, a metal wrap through (MWT) solar cell and a back contact solar cell were developed so as to prevent a reduction in the efficiency of the solar cell resulting from the current collectors. In the MWT solar cell, a current collector connected to an emitter layer is formed on a back surface of a substrate opposite a light incident surface of the substrate. In the back contact solar cell, all of electrodes collecting electrons and holes are formed on a back surface of a substrate.

A solar cell module is manufactured by connecting a plurality of solar cells each having the above-described structure to one another. An electrical connection between the plurality of solar cells is completed by connecting current collectors of the plurality of solar cells in parallel or in series to one another using a connector.

SUMMARY OF THE INVENTION

In one aspect, there is a solar cell including a substrate of a first conductive type, an emitter layer of a second conductive type opposite the first conductive type disposed on the substrate, a plurality of first electrodes electrically connected to the emitter layer, a second electrode electrically connected to the substrate, a first current collector electrically connected to the plurality of first electrodes, and a second current collector electrically connected to the second electrode, the second current collector comprising a plurality of second electrode current collectors electrically connected to the second electrode, and a current collector connector for connecting the plurality of second electrode current collectors to one another.

The plurality of second electrode current collectors may extend in a first direction, and the current collector connector may extend in a second direction crossing the first direction.

The plurality of second electrode current collectors may be positioned on the second electrode, and the current collector connector may be positioned on the emitter layer.

The solar cell may further include a dummy electrode part electrically connected to the plurality of first electrodes. The dummy electrode part may include a dummy electrode extending parallel to the plurality of first electrodes and a dummy connector that extends from the dummy electrode and connects the dummy electrode to at least one of the plurality of first electrodes.

A formation location of the dummy connector may correspond to a formation location of the current collector connector.

The solar cell may further include a plurality of via holes positioned at crossings of the plurality of first electrodes and the first current collector in the substrate. The plurality of first electrodes may extend in a different direction from a direction of the first current collector, and may be electrically connected to one another through the plurality of via holes.

The first current collector and the second current collector may be positioned on a surface of the substrate on which light is not incident.

In another aspect, there is a solar cell module comprising a plurality of solar cells each including a substrate, an emitter layer disposed on the substrate, a plurality of first electrodes electrically connected to the emitter layer, a second electrode electrically connected to the substrate, a first current collector electrically connected to the plurality of first electrodes, and a second current collector electrically connected to the second electrode, a first connector connected to a first current collector of a first solar cell of the plurality of solar cells, and a second connector connected to a second current collector of a second solar cell of the plurality of solar cells, wherein the first connector and the second connector form a right angle on the same plane.

The second current collector may include a plurality of second electrode current collectors electrically connected to the second electrode and a current collector connector for connecting the plurality of second electrode current collectors to one another.

The second connector may be positioned on the current collector connector.

Each of the plurality of solar cells may further include a dummy electrode part electrically connected to the plurality of first electrodes. The dummy electrode part may include a dummy electrode extending parallel to the plurality of first electrodes and a dummy connector that extends from the dummy electrode and connects the dummy electrode to at least one of the plurality of first electrodes.

A formation location of the dummy connector may correspond to a formation location of the current collector connector.

In another aspect, there is a solar cell module comprising a plurality of solar cells each including a substrate, an emitter layer disposed on the substrate, a plurality of first electrodes electrically connected to the emitter layer, a second electrode electrically connected to the substrate, a plurality of first current collectors electrically connected to the plurality of first electrodes, and a second current collector electrically connected to the second electrode, a plurality of first connectors connected to a plurality of first current collectors of a first solar cell of the plurality of solar cells, and a second connector connected to a second current collector of a second solar cell of the plurality of solar cells, wherein a number of the plurality of first connectors is more than a number of the second connector.

The number of the second connector positioned in each of the plurality of solar cells may be one.

The second current collector may include a plurality of second electrode current collectors electrically connected to the second electrode, and a current collector connector for connecting the plurality of second electrode current collectors to one another.

The second connector may be positioned on the current collector connector.

Each of the plurality of solar cells may further include at least one dummy electrode part electrically connected to the plurality of first electrodes. The at least one dummy electrode part may include a dummy electrode extending parallel to the plurality of first electrodes, and a dummy connector that extends from the dummy electrode and connects the dummy electrode to at least one of the plurality of first electrodes.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Reference will now be made in detail to embodiments of the invention, examples of which are illustrated in the accompanying drawings.

A solar cell according to an embodiment of the invention is described below in detail with reference to FIGS. 1 to 6.

Figure 1:
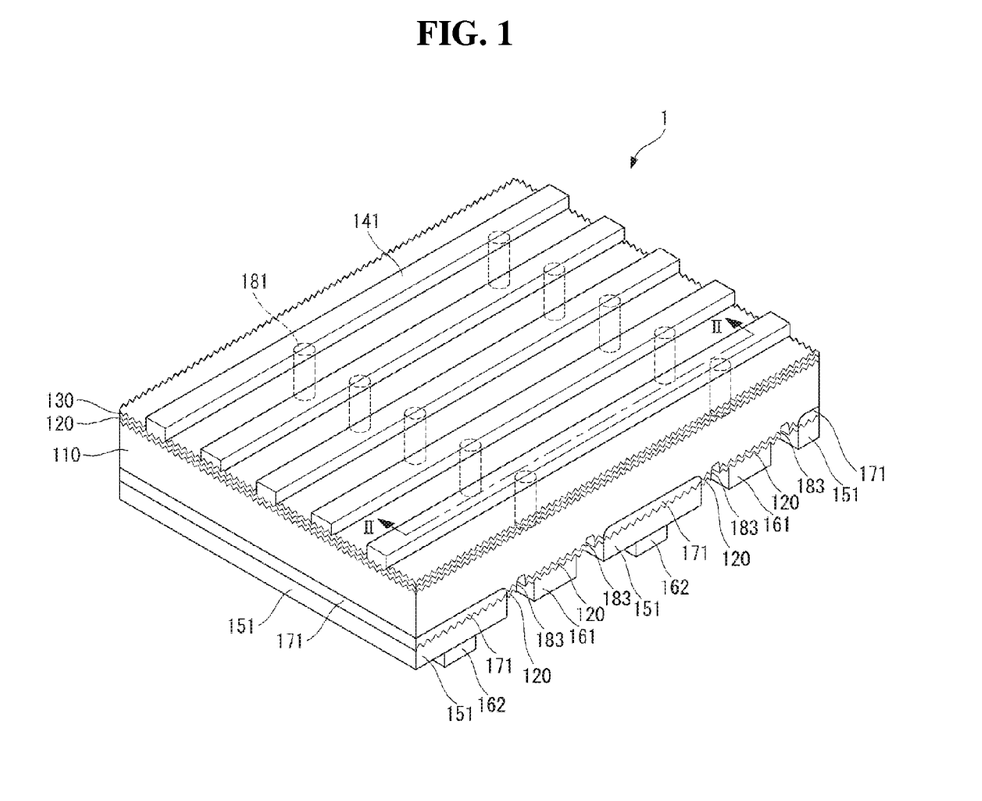
FIG. 1 is a partial perspective view of a solar cell according to an embodiment of the invention.
Figure 2:
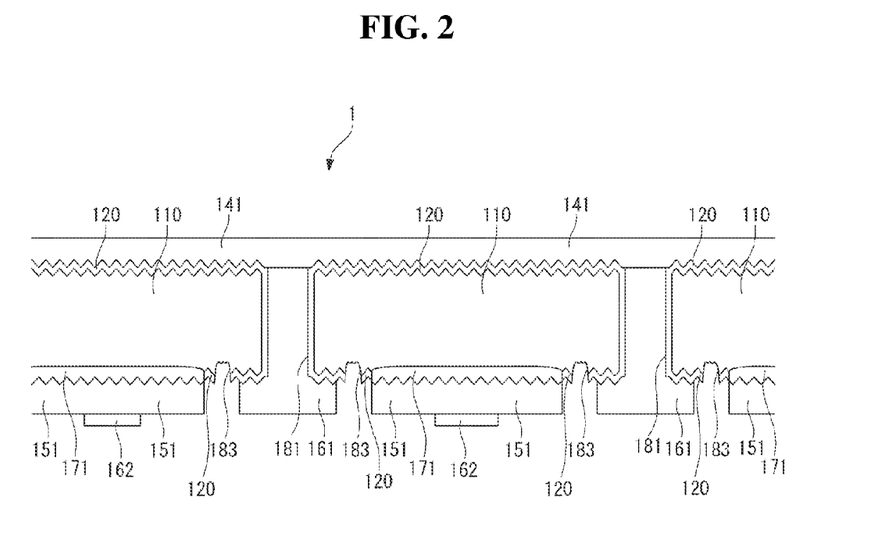
FIG. 2 is a cross-sectional view taken along line II-II of FIG. 1.
Figure 3:
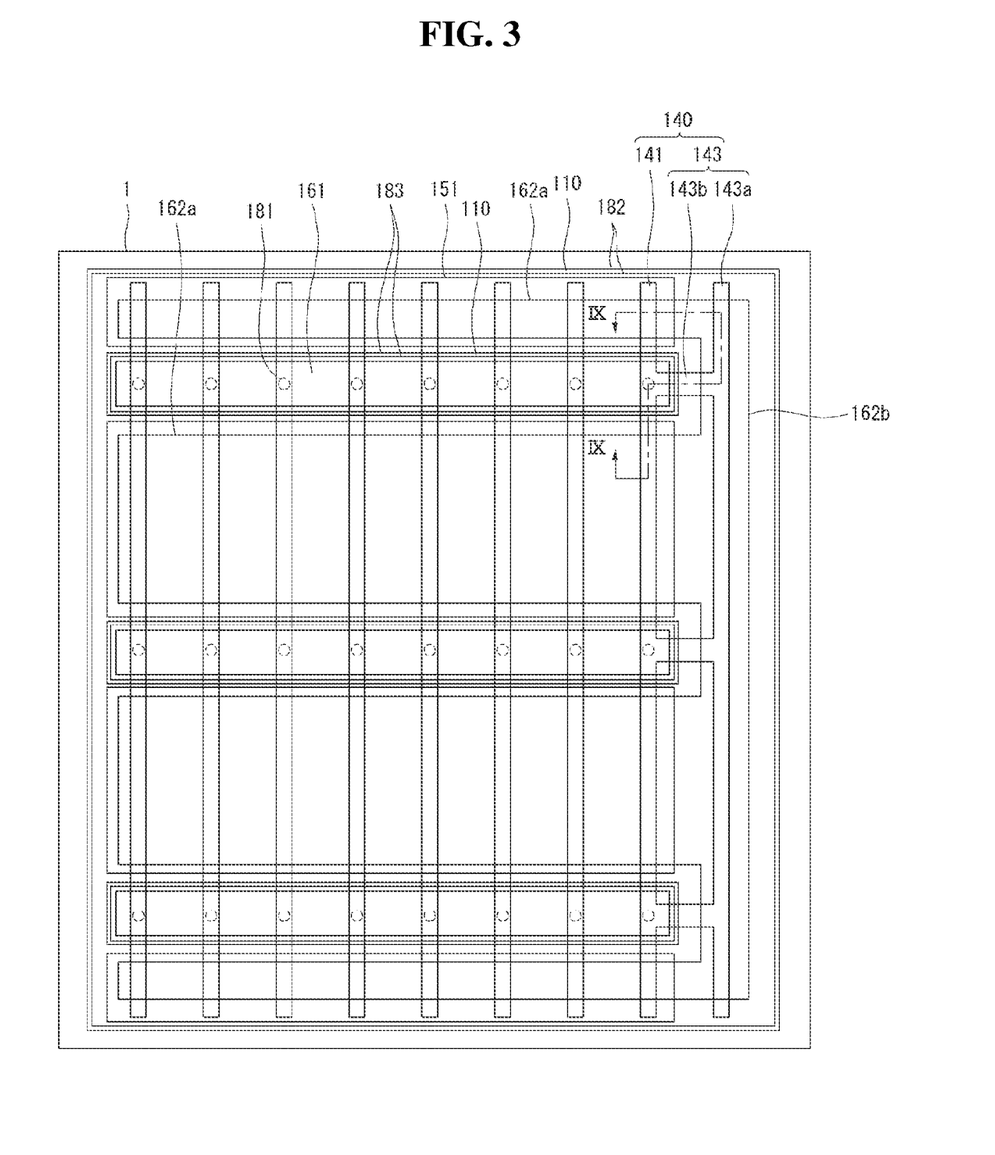
FIG. 3 is a schematic arrangement view of a solar cell according to an embodiment of the invention.
Figure 4:
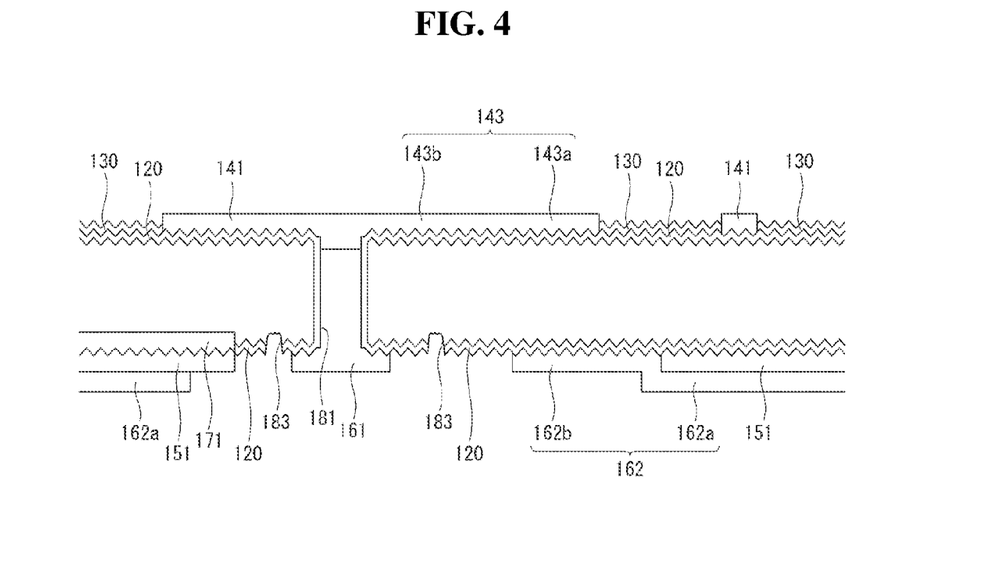
FIG. 4 is a cross-sectional view taken along line IV-IV of FIG. 3.
Figure 5:
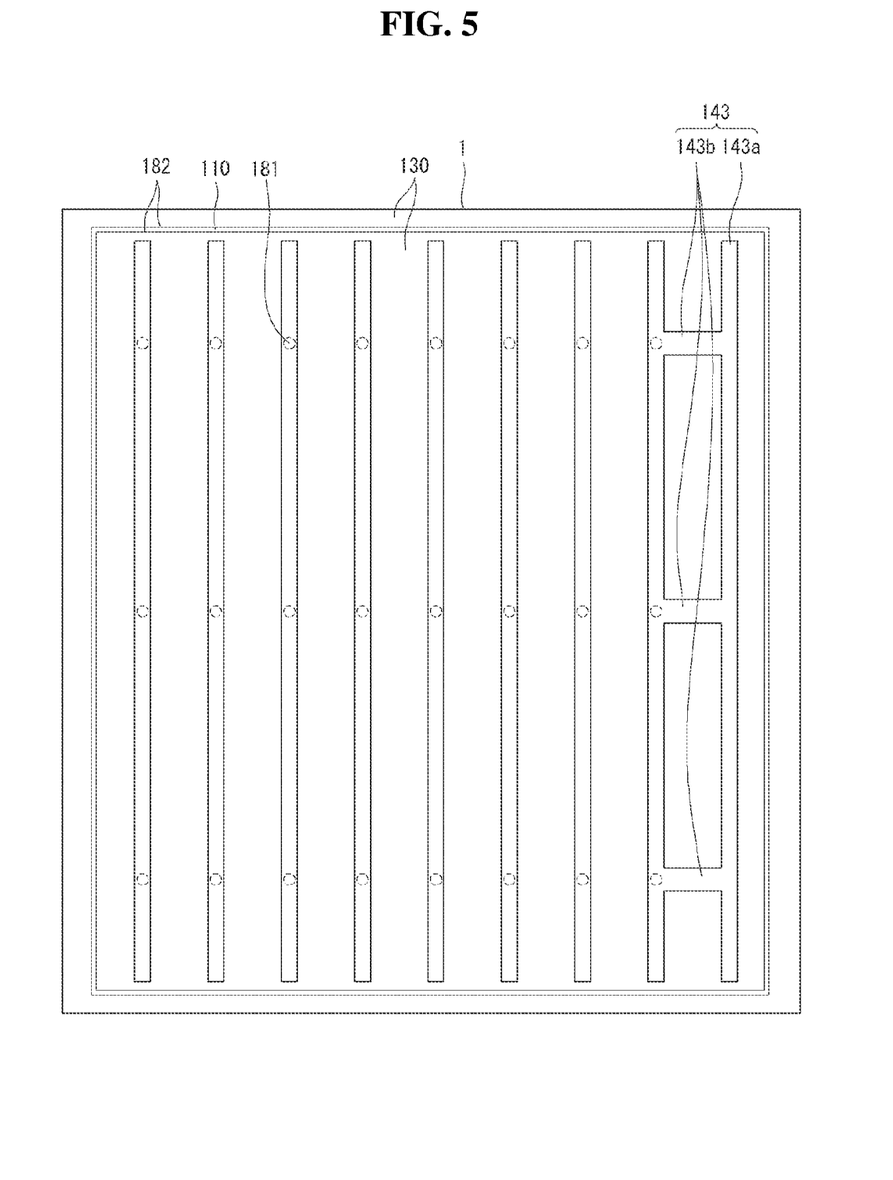
FIG. 5 illustrates a structure of a front electrode part positioned on a front surface of a solar cell according to an embodiment of the invention.
Figure 6:
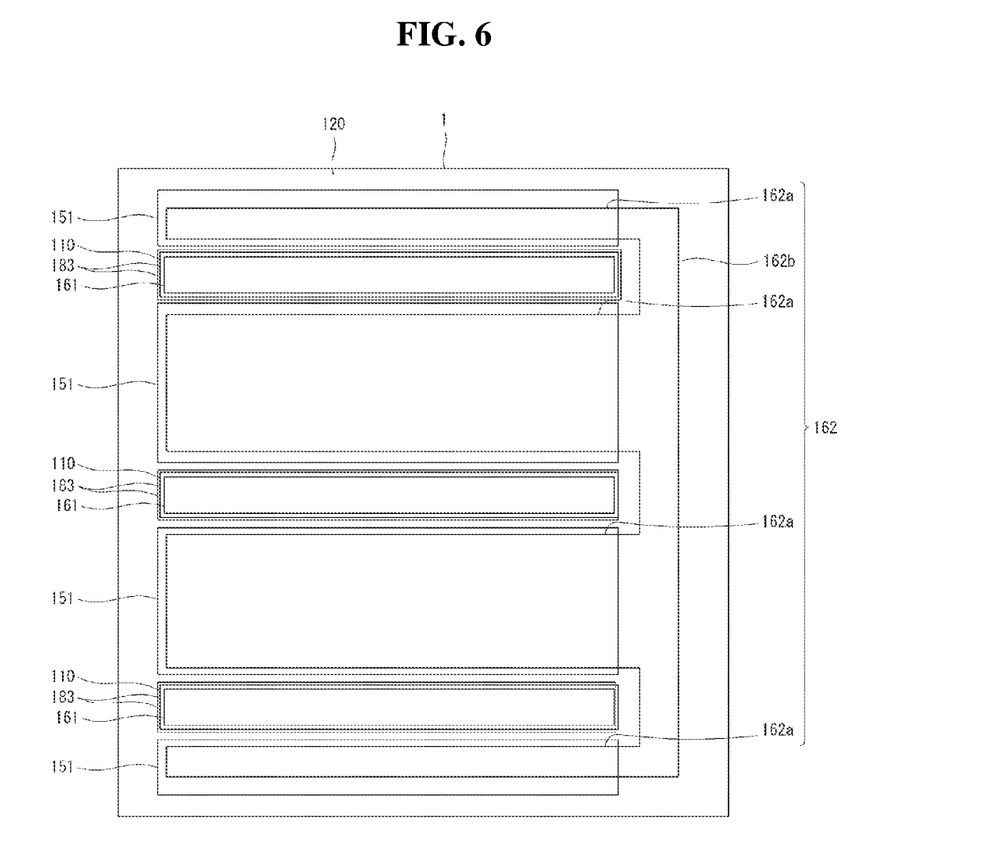
FIG. 6 illustrates a structure of a front electrode current collector and a back electrode current collector part positioned on a back surface of a solar cell.

FIG. 1 is a partial perspective view of a solar cell according to an embodiment of the invention. FIG. 2 is a cross-sectional view taken along line II-II of FIG. 1. FIG. 3 is a schematic arrangement view of the solar cell. FIG. 4 is a cross-sectional view taken along line IV-IV of FIG. 3. FIG. 5 illustrates a structure of a front electrode part positioned on a front surface of the solar cell. FIG. 6 illustrates a structure of a front electrode current collector and a back electrode current collector part positioned on a back surface of the solar cell.

As shown in FIGS. 1 to 3, a solar cell 1 according to an embodiment of the invention includes a substrate 110 having a plurality of via holes 181, an emitter layer 120 on the substrate 110, an anti-reflection layer 130 on the emitter layer 120 positioned on a surface (hereinafter, referred to as "a front surface") of the substrate 110 on which light is incident, a front electrode part 140 positioned on the emitter layer 120 on the front surface of the substrate 110 on which the anti-reflection layer 130 is not formed, a plurality of back electrodes 151 positioned on a surface (hereinafter, referred to as "a back surface"), opposite the front surface of the substrate 110, on which the light is not incident, a plurality of front electrode current collectors 161, a back electrode current collector part 162, and a plurality of back surface field (BSF) layers 171. The front electrode current collectors 161 are positioned in each of the via holes 181 and on the emitter layer 120 on the back surface of the substrate 110 around the via holes 181 and are electrically connected to the front electrode part 140. The back electrode current collector part 162 is positioned on the back surface of the substrate 110 and is electrically connected to the plurality of back electrodes 151. The plurality of BSF layers 171 are positioned between the substrate 110 and the plurality of back electrodes 151.

The substrate 110 is a semiconductor substrate formed of first conductive type silicon, for example, p-type silicon, though not required. Examples of silicon include single crystal silicon, polycrystalline silicon, and amorphous silicon. When the substrate 110 is of a p-type, the substrate 110 contains impurities of a group III element such as boron (B), gallium (Ga), and indium (In). Alternatively, the substrate 110 may be of an n-type, and/or be formed of materials other than silicon. If the substrate 110 is of the n-type, the substrate 110 may contain impurities of a group V element such as phosphor (P), arsenic (As), and antimony (Sb).

The surface of the substrate 110 is textured to form a textured surface corresponding to an uneven surface or having uneven characteristics.

The emitter layer 120 on the substrate 110 is an impurity region of a second conductive type (for example, an n-type) opposite the first conductive type of the substrate 110, and thus the emitter layer 120 and the substrate 110 form a p-n junction. A plurality of electron-hole pairs produced by light incident on the substrate 110 is separated into electrons and holes by a built-in potential difference resulting from the p-n junction. Then, the separated electrons move to the n-type semiconductor, and the separated holes move to the p-type semiconductor. Thus, when the substrate 110 is of the p-type and the emitter layer 120 is of the n-type, the separated holes and the separated electrons move to the substrate 110 and the emitter layer 120, respectively. Accordingly, the holes become major carriers in the substrate 110, and the electrons become major carriers in the emitter layer 120.

Because the substrate 110 and the emitter layer 120 form the p-n junction, the emitter layer 120 may be of the p-type when the substrate 110 is of the n-type unlike the embodiment described above. In this case, the separated electrons and the separated holes move to the substrate 110 and the emitter layer 120, respectively. Returning to the embodiment of the invention, when the emitter layer 120 is of the n-type, the emitter layer 120 may be formed by doping the substrate 110 with impurities of a group V element such as P, As, and Sb. On the contrary, when the emitter layer 120 is of the p-type, the emitter layer 120 may be formed by doping the substrate 110 with impurities of a group III element such as B, Ga, and In.

The anti-reflection layer 130 formed on the emitter layer 120 on the front surface of the substrate 110 is formed of silicon nitride (SiNx) and/or silicon oxide ($SiO_x$). The anti-reflection layer 130 reduces a reflectance of light incident on the substrate 110 and increases selectivity of a predetermined wavelength band, thereby increasing the efficiency of the solar cell 1. The anti-reflection layer 130 may have a singe-layered structure or a multi-layered structure such as a double-layered structure. The anti-reflection layer 130 may be omitted, if desired.

An exposing portion 182 exposing a portion of an edge of the front surface of the substrate 110 is formed in the anti-reflection layer 130 and the emitter layer 120 underlying the anti-reflection layer 130. Thus, the exposing portion 182 electrically separates the emitter layer 120 on the front surface of the substrate 110 from the emitter layer 120 on the back surface of the substrate 110.

The front electrode part 140 includes a plurality of front electrodes 141 and a dummy electrode part 143. The plurality of front electrodes 141 and the dummy electrode part 143 are positioned on the emitter layer 120 on the front surface of the substrate 110 and are electrically and physically connected to the emitter layer 120.

The plurality of front electrodes 141 are spaced apart from one another and extend substantially parallel to one another in a fixed direction.

The dummy electrode part 143 includes a dummy electrode 143a extending substantially parallel to the front electrodes 141 in the same direction as the front electrodes 141 and a plurality of dummy connectors 143b, each of which extends from the dummy electrode 143a and is connected to the front electrode 141 adjacent to the dummy electrode 143a. The dummy electrode 143a is electrically and physically connected to the front electrode 141 adjacent to the dummy electrode 143a through the dummy connectors 143b.

A formation location and the number of the dummy connectors 143b may vary depending on a formation location of the via holes 181, a length of the front electrodes 141, a length of the dummy electrode 143a, etc.

The front electrodes 141 and the dummy electrode part 143 collect carriers (e.g., electrons) moving to the emitter layer 120 to transfer the carriers to the front electrode current collectors 161 electrically connected to the front electrodes 141 and the dummy electrode part 143 through the via holes 181.

The front electrodes 141 and the dummy electrode part 143 contain at least one conductive material. Examples of the conductive material include at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

Each of the front electrode current collectors 161 on the back surface of the substrate 110 is referred to as a bus bar and is formed of at least one conductive material. The front electrode current collectors 161 extend in a direction crossing an extending direction of the front electrodes 141 on the front surface of the substrate 110 and have a stripe shape.

As shown in FIGS. 4 and 5, the plurality of via holes 181 are respectively formed in crossings of the front electrodes 141 and the front electrode current collectors 161. Thus, the via holes 181 are not formed along the dummy electrode 143a that does not cross the front electrode current collector 161.

At least one of the front electrode 141 and the front electrode current collector 161 extends to the front surface or the back surface of the substrate 110 through the via hole 181, and thus the front electrode 141 and the front electrode current collector 161 respectively positioned on the opposite surfaces of the substrate 110 are connected to one another. Hence, the front electrodes 141 are electrically and physically connected to the front electrode current collectors 161 through the via holes 181.

The front electrode current collectors 161 output the carriers transferred from the front electrodes 141 and the dummy electrode part 143 electrically connected to the front electrode current collectors 161 to an external device.

In the embodiment of the invention, the front electrode current collectors 161 contain Ag, but may contain at least one selected from the group consisting of Ni, Cu, Al, Sn, Zn, In, Ti, Au, and a combination thereof instead of Ag. Other conductive materials may be used. The back electrodes 151 on the back surface of the substrate 110 are positioned to be spaced apart from the front electrode current collectors 161 adjacent to the back electrodes 151. The back electrodes 151, as shown in FIG. 6, are positioned on almost the entire back surface of the substrate 110 excluding an edge portion and a formation portion of the front electrode current collectors 161 from the back surface of the substrate 110. The back electrodes 151 collect carriers (e.g., holes) moving to the substrate 110.

The emitter layer 120 on the back surface of the substrate 110 has a plurality of expositing portions 183 that expose portions of the back surface of the substrate 110 and surround the front electrode current collectors 161. The expositing portions 183 block an electrical connection between the front electrode current collectors 161 collecting electrons or holes and the back electrodes 151 collecting holes or electrons, thereby causing the electrons and the holes to move smoothly.

The back electrodes 151 contain at least one conductive material, such as Al. For example, the back electrodes 151 may contain at least one selected from the group consisting of Ni, Cu, Ag, Sn, Zn, In, Ti, Au, and a combination thereof or may contain other conductive materials.

The back electrode current collector part 162 includes a plurality of back electrode current collectors 162a and a current collector connector 162b for connecting the back electrode current collectors 162a to one another.

The back electrode current collectors 162*a* are mainly positioned on the back electrodes 151 and extend substantially parallel to the front electrode current collectors 161.

The current collector connector 162*b* is mainly positioned on the emitter layer 120 positioned at one edge of the back surface of the substrate 110 and extends from one end of each of the back electrode current collectors 162*a* in a direction crossing an extending direction of the back electrode current collectors 162*a*. Hence, the one end of each of the back electrode current collectors 162*a* is electrically and physically connected to one another through the current collector connector 162*b*. Thus, the back electrode current collectors 162*a* collect the carriers (e.g., holes) transferred from the back electrodes 151 electrically connected to the back electrode current collectors 162*a*, and the current collector connector 162*b* outputs the carriers collected by the back electrode current collectors 162*a* to the outside.

As shown in FIG. 3, the dummy electrode 143*a* of the dummy electrode part 143 is positioned in a portion of the front surface of the substrate 110 corresponding to a location of the current collector connector 162*b*. Thus, because the number of dummy electrodes 143*a* may be determined depending on the size of the current collector connector 162*b* (i.e., a transverse width of the current collector connector 162*b*), the number of dummy electrodes 143*a* may vary.

The back electrode current collector part 162 is formed of the same material as the front electrode current collectors 161. Thus, the back electrode current collector part 162 contains at least one conductive material, such as Ag. For example, the back electrode current collector part 162 may contain at least one selected from the group consisting of Ni, Cu, Al, Sn, Zn, In, Ti, Au, and a combination thereof or may contain other conductive materials.

Although the embodiment of the invention illustrates the three front electrode current collectors 161 and the four back electrodes 151, the number of front electrode current collectors 161 and the number of back electrodes 151 may vary if desired.

Each of the BSF layers 171 between the back electrodes 151 and the substrate 110 is a region (e.g., a p+-type region) that is more heavily doped with impurities of the same conductive type as the substrate 110 than the substrate 110. The movement of electrons to the back surface of the substrate 110 is prevented or reduced by a potential barrier resulting from a difference between impurity doping concentrations of the substrate 110 and the BSF layers 171. Thus, a recombination and/or a disappearance of the electrons and the holes around the surface of the substrate 110 are prevented or reduced.

In the embodiment of the invention, because the back electrode current collectors 162*a* corresponding to a portion of the back electrode current collector part 162 are positioned on the back electrodes 151, a formation area of the BSF layers 171 increases by the size of a formation area of the back electrode current collectors 162*a*.

The solar cell 1 according to the embodiment of the invention having the above-described structure is a solar cell in which the front electrode current collectors 161 electrically connected to the front electrodes 141 are positioned on the back surface of the substrate 110 on which light is not incident. An operation of the solar cell 1 is described below.

When light irradiated to the solar cell 1 is incident on the substrate 110 through the anti-reflection layer 130 and the emitter layer 120, a plurality of electron-hole pairs are generated in the substrate 110 by light energy based on the incident light. Because the surface of the substrate 110 is the textured surface, a light reflectance throughout the entire surface of the substrate 110 is reduced. Further, because both a light incident operation and a light reflection operation are performed on the textured surface of the substrate 110, the light is confined in the solar cell 1. Hence, a light absorption increases and the efficiency of the solar cell 1 is improved. In addition, because a reflection loss of the light incident on the substrate 110 is reduced by the anti-reflection layer 130, an amount of light incident on the substrate 110 further increases.

The electron-hole pairs are separated into electrons and holes by the p-n junction of the substrate 110 and the emitter layer 120, and the separated electrons move to the n-type emitter layer 120 and the separated holes move to the p-type substrate 110. The electrons moving to the n-type emitter layer 120 are collected by the front electrodes 141 and the dummy electrode part 143 and then move to the front electrode current collectors 161 electrically connected to the front electrodes 141 and the dummy electrode part 143 through the via holes 181. The holes moving to the p-type substrate 110 are collected by the back electrodes 151 through the BSF layers 171 and then move to the back electrode current collector part 162. When the front electrode current collectors 161 are connected to the back electrode current collector part 162 using electric wires (not shown), current flows therein to thereby enable use of the current for electric power.

In the embodiment of the invention, because the formation area of the BSF layers 171 increases by the size of the formation area of the back electrode current collectors 162*a*, a recombination and/or a disappearance of electrons and holes generated in the back surface of the substrate 110 is prevented or reduced. Hence, the efficiency of the solar cell 1 is improved.

Although the above-described solar cell 1 may be individually used, the plurality of solar cells 1 having the same structure may be electrically connected to one another to form a solar cell module for more efficient use of the solar cells 1.

A solar cell module using the solar cells 1 according to the embodiment of the invention is described below with reference to FIGS. 7 and 8.

Figure 7:
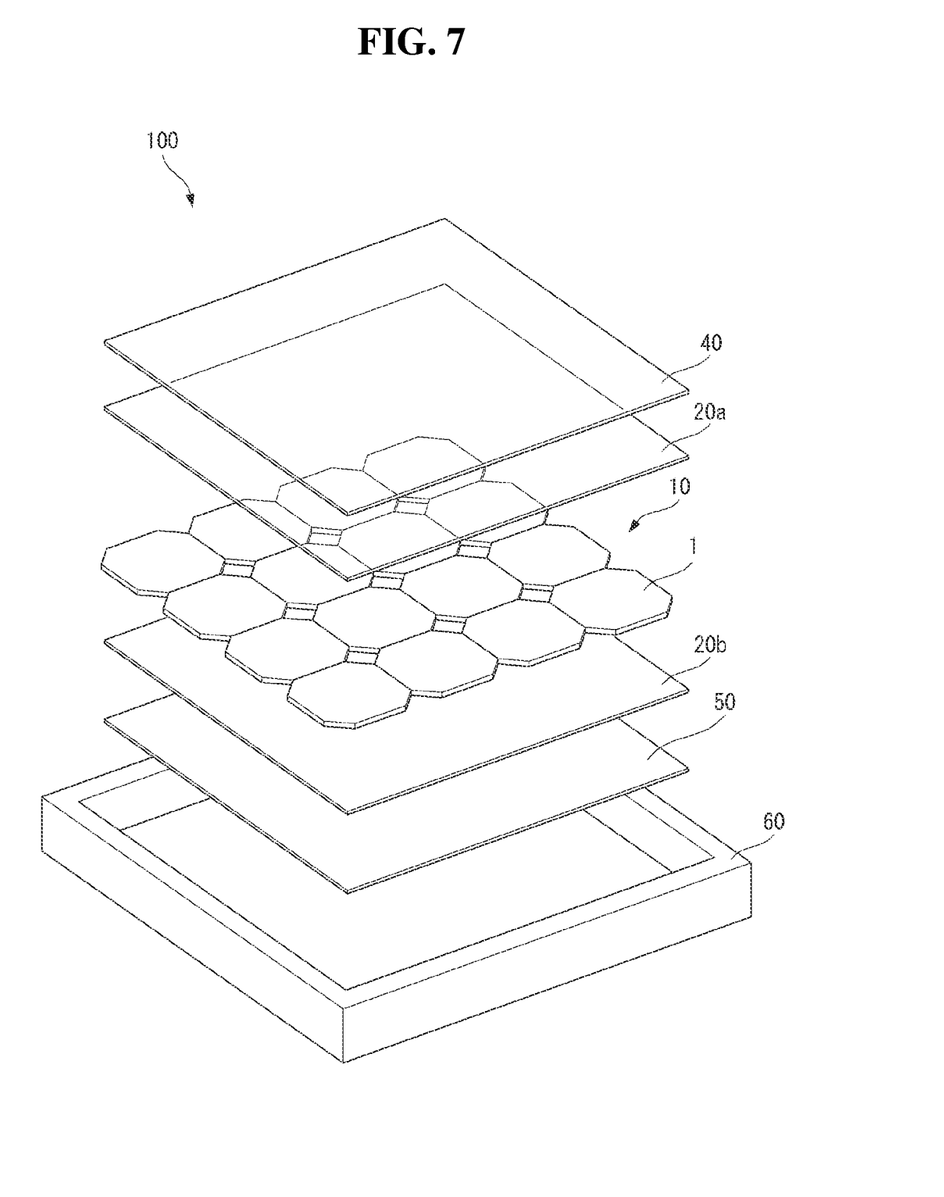
FIG. 7 is a schematic perspective view of a solar cell module according to an embodiment of the invention.
Figure 8:
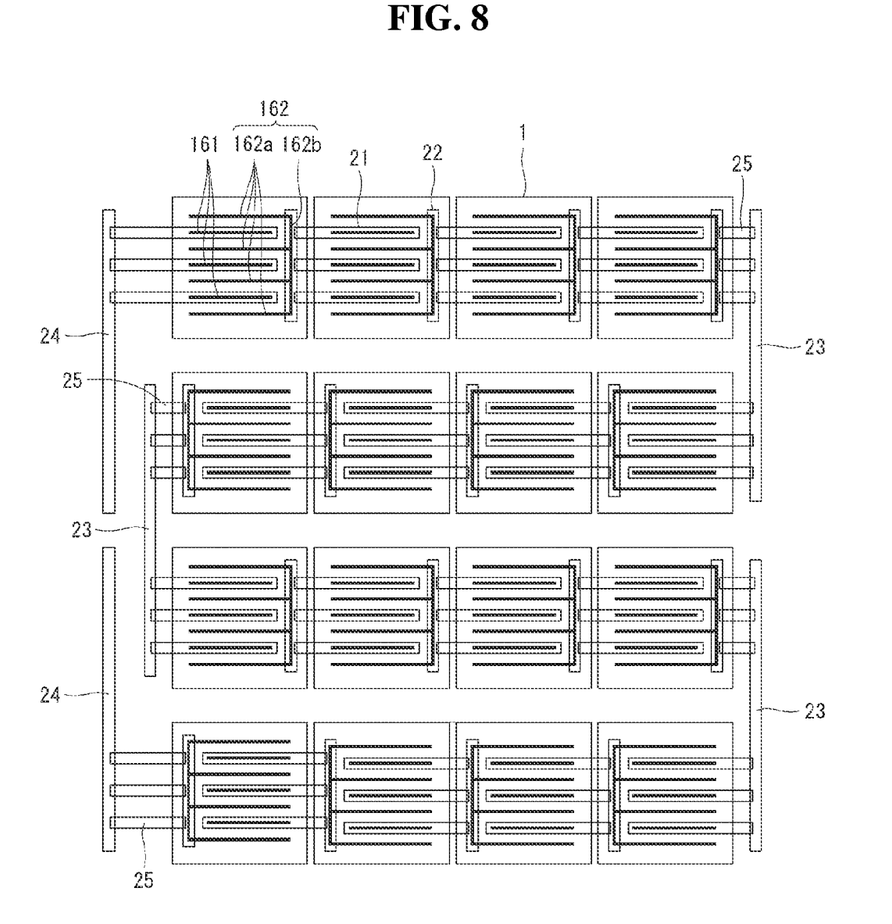
FIG. 8 illustrates a schematic connection state of a solar cell array.

FIG. 7 is a schematic perspective view of a solar cell module according to an embodiment of the invention, and FIG. 8 illustrates a schematic connection state of a solar cell array.

As shown in FIG. 7, a solar cell module 100 according to an embodiment of the invention includes a solar cell array 10, protective layers 20*a* and 20*b* for protecting the solar cell array 10, a transparent member 40 on the protective layer 20*a* (hereinafter, referred to as "upper protective layer") positioned on a light receiving surface of the solar cell array 10, a back sheet 50 underlying the protective layer 20*b* (hereinafter, referred to as "lower protective layer") positioned on a surface, opposite the light receiving surface, on which light is not incident, and a frame 60 for receiving the above components 10, 20*a*, 20*b*, 40, and 50.

The back sheet 50 prevents moisture or oxygen from penetrating into a back surface of the solar cell module 100 to protect solar cells 1 from an external environment. The back sheet 50 may have a multi-layered structure including a moisture/oxygen penetrating prevention layer, a chemical corrosion prevention layer, an insulation layer, etc.

The upper and lower protective layers 20*a* and 20*b* prevent corrosion of metal resulting from the moisture penetration and protect the solar cell module 100 from an impact. The upper and lower protective layers 20*a* and 20*b* and the solar cell array 10 form an integral body when a lamination process is performed in a state where the upper and lower protective layers 20*a* and 20*b* are respectively positioned on and under the solar cell array 10. The upper and lower protective layers 20a and 20b may be formed of ethylene vinyl acetate (EVA), polyvinyl butyral (PVB), partial oxide of ethylene vinyl acetate (EVA), silicon resin, ester-based resin, and olefin-based resin. Other materials may be used.

The transparent member 40 on the upper protective layer 20a is formed of a tempered glass having a high transmittance capable of preventing a damage. The tempered glass may be a low iron tempered glass containing a small amount of iron. The transparent member 40 may have an embossed inner surface so as to increase a scattering effect of light.

The frame 60 is formed of a material that is coated with an insulating material and does not corrode and is not deformed by an external environment, for example, aluminum. The frame 60 has a structure that is easy to install.

As shown in FIGS. 7 and 8, the solar cell array 10 includes the plurality of solar cells 1 arranged in a matrix structure, and each of the solar cells 1 are connected in series to one another by a plurality of connectors 21 to 25. Although FIGS. 7 and 8 illustrate the solar cell array 10 having the structure of 4×4 matrix, the number of solar cells 1 may vary in column and row directions, if necessary.

The adjacent solar cells 1 in the same row have the same structure, and the adjacent solar cells 1 in the same column have different structures.

For example, as shown in FIG. 8, each of the solar cells 1 arranged in odd-numbered rows has a structure in which a current collector connector 162b of a back electrode current collector part 162 is positioned on the right side, and each of the solar cells 1 arranged in even-numbered rows has a structure in which a current collector connector 162b of a back electrode current collector part 162 is positioned on the left side. Thus, the solar cell 1 arranged in a row and the solar cell 1 arranged in another row next to the row are symmetric in the disposition of front electrode current collectors 161 and the back electrode current collector part 162. Further, a disposition form in the solar cells 1 arranged in the odd-numbered rows and a disposition form in the solar cells 1 arranged in the even-numbered rows may be reversed.

The plurality of connectors 21 to 25 includes first to fifth connectors 21 to 25.

The plurality of first connectors 21 are positioned on the front electrode current collectors 161 along the front electrode current collectors 161. Each of the first connectors 21 extends to a position outside the corresponding solar cell 1 and thus extends to the solar cell 1 adjacent to the corresponding solar cell 1 in the same row.

The plurality of second connectors 22 are positioned on the current collector connector 162b of the back electrode current collector part 162 along the current collector connector 162b. Each of the second connectors 22 extends inside the corresponding solar cell 1. Thus, the front electrode current collectors 161 and the back electrode current collector parts 162 of two adjacent solar cells 1 in the same row are electrically connected to each other.

Further, because the front electrode current collectors 161 and the current collector connector 162b of the back electrode current collector parts 162 extend in a crossing direction therebetween, the plurality of first connectors 21 and the plurality of second connectors 22 extend in a crossing direction therebetween. Thus, the second connectors 22 and the first connectors 21 connected to the second connectors 22 form a right angle on the same plane.

The plurality of third connectors 23 are used to connect in series the solar cells 1 arranged in different rows to one another. For this, the third connector 23 electrically connects the front electrode current collectors 161 and the back electrode current collector parts 162 of the two adjacent solar cells 1 arranged in a first column to each other and electrically connects the front electrode current collectors 161 and the back electrode current collector parts 162 of the two adjacent solar cells 1 arranged in a last column to each other. Thus, the plurality of third connectors 23 longitudinally extend. It is preferable, but not required, that an extension length of each of the third connectors 23 is smaller than a total length of the two adjacent solar cells 1 arranged in the same column.

The plurality of fourth connectors 24 is electrically connected to the front electrode current collectors 161 of the solar cell 1 arranged in a first row and a first column and are electrically connected to the back electrode current collector parts 162 of the solar cell 1 arranged in a last row and the first column. Further, the plurality of fourth connectors 24 are electrically connected to an external device, such as a junction box. Thus, the number of the fourth connectors 24 is two. One of the two fourth connectors 24 is electrically connected to the front electrode current collectors 161, and the other is electrically connected to the back electrode current collector parts 162.

A length of the first connector 21 connected to the third and fourth connectors 23 and 24 may be longer than a length of the first connector 21 connected to the current collector connector 162b for the electrical connection between the adjacent solar cells 1 arranged in the same row. Further, a length of the first connector 21 connected to the fourth connector 24 may be longer than a length of the first connector 21 connected to the third connector 23. The length of the first connector 21 is not limited to the above-described relationship.

The plurality of fifth connectors 25 are positioned between the current collector connectors 162b of the solar cells 1 arranged in the first and last columns and the third or fourth connector 23 or 24 adjacent to the current collector connectors 162b arranged in the first and last columns to electrically connect the current collector connectors 162b arranged in the first and last columns to the third or fourth connector 23 or 24. Because the third and fourth connectors 23 and 24 are electrically connected to the current collector connectors 162b through the fifth connectors 25, the front electrode current collectors 161 and the back electrode current collector part 162 of two adjacent solar cells 1 arranged in different rows and the same column are electrically connected to one another. Thus, the solar cells 1 arranged in different rows are connected in series to one another.

Accordingly, as shown in FIG. 8, a total of three first connectors 21 and one second connector 22 are positioned in each of the solar cells 1 included in the solar cell array 10 except the solar cells 1 arranged in the first and last columns, and three first connectors 21 positioned in one of two adjacent solar cells 1 arranged in the same row and one second connector 22 positioned in the other solar cell 1 are connected to one another substantially at right angles. Further, because the number of first connectors 21 positioned in each of the solar cells 1 varies depending on the number of front electrode current collectors 161, the number of first connectors 21 may vary if necessary.

The first to fifth connectors 21 to 25 are formed of a conductive tape (generally called a "ribbon") that is a string-shaped thin metal plate formed of a conductive material. Examples of the conductive material include at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

In the solar cell module 100 shown in FIG. 8, the plurality of solar cells are connected in series to one another through the first to fifth connectors 21 to 25 to form the solar cell array 10.

In a related art, a plurality of connectors is individually attached to a plurality of back electrode current collectors of each of solar cells. On the other hand, in the embodiment of the invention, because the back electrode current collectors 162a are connected to one another through the current collector connector 162b, the second connector 22 is attached to only on the current collector connector 162b. Thus, only one second connector 22 is positioned in the back electrode current collector part 162 of each solar cell 1. In other words, time required to attach the second connector 22 to the back electrode current collector part 162 is reduced, and thus manufacturing time of the solar cell 1 is reduced. Further, the number of second connector 22 used in the solar cell module 100 is reduced, and thus the manufacturing cost of the solar cell 1 is reduced.

Because the first connectors 21 being the conductive tape are attached in a transverse direction and the second connectors 22 are connected in a longitudinal direction, a tension resulting from the conductive tape is diffused in several directions of the solar cell array 10. Thus, a bending phenomenon of the solar cells 1 is reduced, and a damage of the solar cells 1 is reduced.

Since FIG. 8 schematically illustrates a shape of the front electrode current collectors 161, a shape of the back electrode current collector part 162, and a disposition relationship therebetween, a distance between the front electrode current collectors 161 and the back electrode current collector part 162 or the size of each of the front electrode current collectors 161 and the back electrode current collector part 162 may vary.

FIG. 8 illustrates that a width of each of the first to fifth connectors 21 to 25 is greater than a width of each of the components 161 and 162. However, the width of each of the first to fifth connectors 21 to 25 may be equal to or less than the width of each of the components 161 and 162. Further, a length of each of the first to fifth connectors 21 to 25 may vary if necessary.

In addition, FIG. 8 illustrates one example of the electrical connection between the solar cells 1, and the electrical connection between the solar cells 1 may vary. For example, the disposition form of the solar cells 1 arranged in the odd-numbered rows and the disposition form of the solar cells 1 arranged in the even-numbered rows may vary, and the fourth connector 24 may be positioned on the right unlike FIG. 8.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell, comprising:
a substrate of a first conductive type and having a plurality of via holes; the substrate comprising a major plane
an emitter layer of a second conductive type opposite the first conductive type disposed on a first surface of the substrate;
a plurality of first electrodes electrically connected to the emitter layer and positioned on the first surface of the substrate;
a supplementary electrode part directly contacted to an outermost first electrode of the plurality of first electrodes and positioned on the first surface of the substrate;
a second electrode electrically connected to the substrate and positioned on a second surface opposite to the first surface of the substrate;
a first current collector electrically connected to the plurality of first electrodes through the plurality of via holes and positioned on the second surface of the substrate; and
a second current collector positioned on the second surface of the substrate and comprising a plurality of second electrode current collectors and a current collector connector, the plurality of second electrode current collectors being extended in a first direction and electrically connected to the second electrode, and the current collector connector being extended in a second direction crossing the first direction and connecting the plurality of second electrode current collectors to one another,
wherein the supplementary electrode part comprises a supplementary electrode and a supplementary connector, the supplementary electrode extends parallel to the plurality of first electrodes, and the supplementary connector extends from the supplementary electrode and contacts to the outermost first electrode of the plurality of first electrodes, and the supplementary electrode part is connected to the first current collector through the outermost first electrode, and a position of the supplementary electrode is overlapped with a position of the current collector connector in a direction perpendicular to the major plane of the substrate and not overlapped in that direction with the plurality of via holes, and
a position of the plurality of first electrodes is overlapped with the plurality of via holes in a direction perpendicular to the major plane of the substrate and the plurality of first electrodes are electrically connected to the first current collector through the plurality of via holes.

2. The solar cell of claim 1, wherein the plurality of second electrode current collectors is positioned on the second electrode, and the current collector connector is positioned on the emitter layer.

3. The solar cell of claim 1, wherein a formation location of The supplementary connector corresponds to a formation location of the current collector connector.

4. The solar cell of claim 1, wherein the plurality of first electrodes extend in a direction different from a direction of the first current collector, and
the plurality of via holes are positioned at crossings of the plurality of first electrodes and the first current collector in the substrate.

5. The solar cell of claim 4, wherein the first current collector and the second current collector are positioned on a surface of the substrate on which light is not incident.

6. A solar cell module, comprising:
a plurality of solar cells each including a substrate having a plurality of via holes, the substrate comprising a major plane an emitter layer disposed on a first surface of the substrate, a plurality of first electrodes electrically connected to the emitter layer, a supplementary electrode part directly contacted to an outermost first electrode of the plurality of first electrodes and positioned on the first surface of the substrate, a second electrode electrically connected to the substrate and positioned on a second surface opposite to the first surface of the substrate, a first current collector electrically connected to the plurality of first electrodes through the plurality of via holes and positioned on the second surface of the substrate, and a second current collector electrically connected to the second electrode positioned on the second surface of the substrate;

a first connector connected to the first current collector of a first solar cell of the plurality of solar cells; and a second connector connected to the second current collector of a second solar cell of the plurality of solar cells, wherein the first connector and the second connector form a right angle on the same plane, and the supplementary electrode part comprises a supplementary electrode and a supplementary connector, the supplementary electrode extends parallel to the plurality of first electrodes, and the supplementary connector extends from the supplementary electrode and connects the supplementary electrode to the outermost first electrode of the plurality of first electrodes, and the supplementary electrode part is connected to the first current collector through the outermost first electrode, and a position of the supplementary electrode is overlapped with a position of the second connector in a direction perpendicular to the major plane of the substrate and not overlapped in that direction with the plurality of via holes, and a position of the plurality of first electrodes is overlapped with the plurality of via holes in a direction perpendicular to the major plane of the substrate and the plurality of first electrodes are electrically connected to the first current collector through the plurality of via holes.

7. The solar cell module of claim 6, wherein, in the each of the plurality of solar cells, the second current collector comprises a plurality of second electrode current collectors electrically connected to the second electrode and a current collector connector for connecting the plurality of second electrode current collectors to one another.

8. The solar cell module of claim 7, wherein the second connector is positioned on the current collector connector.

9. The solar cell module of claim 6, wherein a formation location of the supplementary connector corresponds to a formation location of a current collector connector.

10. A solar cell module, comprising:
a plurality of solar cells each including a substrate having a plurality of via holes, the substrate comprising a major plane an emitter layer disposed on a first surface of the substrate, a plurality of first electrodes electrically connected to the emitter layer, a supplementary electrode part directly contacted to an outermost first electrode of the plurality of first electrodes and positioned on the first surface of the substrate, a second electrode electrically connected to the substrate and positioned on a second surface opposite to the first surface of the substrate, a plurality of first current collectors electrically connected to the plurality of first electrodes through the plurality of via holes and positioned on the second surface of the substrate, and a second current collector electrically connected to the second electrode positioned on the second surface of the substrate;

a plurality of first connectors connected to a plurality of first current collectors of a first solar cell of the plurality of solar cells; and a second connector connected to a second current collector of a second solar cell of the plurality of solar cells, wherein a number of the plurality of first connectors is more than a number of the second connector, and the supplementary electrode part comprises a supplementary electrode and a supplementary connector, the supplementary electrode extends parallel to the plurality of first electrodes, and the supplementary connector extends from the supplementary electrode and connects the supplementary electrode to the outermost first electrode of the plurality of first electrodes, and the supplementary electrode part is connected to the first current collector through the outermost first electrode, and a position of the supplementary electrode is overlapped with a position of the second connector in a direction perpendicular to the major plane of the substrate and not overlapped in that direction with the plurality of via holes, and a position of the plurality of first electrodes is overlapped with the plurality of via holes in a direction perpendicular to the major plane of the substrate and the plurality of first electrodes are electrically connected to the first current collector through the plurality of via holes.

11. The solar cell module of claim 10, wherein the number of second connectors positioned in each of the plurality of solar cells is one.

12. The solar cell module of claim 10, wherein the second current collector comprises a plurality of second electrode current collectors electrically connected to the second electrode, and a current collector connector for connecting the plurality of second electrode current collectors to one another.

13. The solar cell module of claim 12, wherein the second connector is positioned on the current collector connector.

* * * * *